(12) United States Patent
Alphonse et al.

(10) Patent No.: US 6,879,610 B2
(45) Date of Patent: Apr. 12, 2005

(54) NARROW SPECTRAL WIDTH LIGHT EMITTING DEVICES

(75) Inventors: Gerard Alphonse, Princeton, NJ (US); Winston Chan, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 10/461,697

(22) Filed: Jun. 13, 2003

(65) Prior Publication Data

US 2004/0065890 A1 Apr. 8, 2004

Related U.S. Application Data

(60) Provisional application No. 60/414,277, filed on Sep. 27, 2002.

(51) Int. Cl.[7] ................................................ H01S 5/00
(52) U.S. Cl. ......................................... 372/44; 372/49
(58) Field of Search ..................... 372/43–50; 359/344; 257/189, 466

(56) References Cited

U.S. PATENT DOCUMENTS

| | | | |
|---|---|---|---|
| 4,789,881 A | 12/1988 | Alphonse | |
| 4,793,679 A | 12/1988 | Toda et al. | |
| 4,821,276 A | 4/1989 | Alphonse et al. | |
| 4,821,277 A | 4/1989 | Alphonse et al. | |
| 4,896,195 A * | 1/1990 | Jansen et al. | ................ 359/344 |
| 4,958,355 A | 9/1990 | Alphonse et al. | |
| 5,574,304 A * | 11/1996 | Mushiage et al. | .......... 257/466 |
| 6,018,536 A | 1/2000 | Alphonse | |
| 6,034,380 A | 3/2000 | Alphonse et al. | |
| 6,097,743 A | 8/2000 | Alphonse | |
| 6,175,446 B1 | 1/2001 | Alphonse | |
| 6,184,542 B1 | 2/2001 | Alphonse | |
| 6,339,606 B1 | 1/2002 | Alphonse | |
| 6,363,088 B1 | 3/2002 | Alphonse | |
| 6,363,188 B1 | 3/2002 | Alphonse | |
| 6,417,524 B1 | 7/2002 | Alphonse | |
| 6,430,207 B1 | 8/2002 | Alphonse | |
| 6,593,602 B2 * | 7/2003 | Liang et al. | ................. 257/189 |

FOREIGN PATENT DOCUMENTS

JP          04237181 A  *  8/1992  ............. H01S/3/18

OTHER PUBLICATIONS

Gerard A. Alphonse, "Design of High–Power Superluminescent Diodes With Low Spectral Modulation," SPIE vol. 4648, pp. 125–137, Jan. 2002.

* cited by examiner

*Primary Examiner*—Quyen Leung
(74) *Attorney, Agent, or Firm*—William J. Burke, Esq.

(57) ABSTRACT

A light emitting device outputs amplified spontaneous emissions confined to a single spatial mode, where the spectral emission is shaped. In one aspect, an absorption layer is provided having a cutoff wavelength shorter than the quantum wavelength of the light emitting device. In another aspect, an interference filter at the front facet provides spectral shaping.

17 Claims, 3 Drawing Sheets

NARROW SPECTRAL WIDTH LIGHT EMITTING DEVICES

CROSS REFERENCE TO RELATED APPLICATIONS

This application claims priority to U.S. Provisional Application No. 60/414,277, filed on Sep. 27, 2002, entitled "Narrow Spectral Width Super-Luminescent Diode Using Integrated Absorber," and is related to U.S. application Ser. No. 10/461,023 filed on Jun. 13, 2003, entitled "Light Emitting Device with Low Back Facet Reflections."

FIELD OF THE INVENTION

The invention relates generally to light emitting devices and more particularly to controllably reducing the spectral widths of light emitting devices.

BACKGROUND

Superluminescent diodes (SLDs) are optical devices that provide amplified spontaneous emission outputs confined to one spatial mode. The spatial distribution of the output light is similar to a laser while the spectral distribution is similar to an LED. SLDs are often specified for applications requiring high beam quality, but where the narrow linewidth of the laser is undesirable or detrimental. An SLD typically has a structure similar to that of a laser, with lasing being prevented by antireflection coatings formed on the end faces. One such device is described in U.S. Pat. No. 4,821,277, which is incorporated herein by reference and which is characterized by a tilted waveguide structure. The axis of symmetry of the waveguide is formed at an angle relative to the direction perpendicular to at least one of the end faces and the tangent of the angle is greater than or equal to the width of the effective optical beam path divided by the length of the body between the end faces.

The spectral width of the SLD is determined by the emission of spectrum, and is typically 20 to 40 nanometers for SLDs emitting light between 0.7 to 1.5 micrometers in wavelength. In a typical SLD, such as described in the U.S. Pat. No. 4,821,277 and U.S. Pat. No. 6,417,529, which is also incorporated herein by reference, the device emits light at wavelengths equivalent to or somewhat shorter than the quantum well wavelength. This wavelength corresponds to the difference in the quantum well electron and hole energy levels. The density of states in the quantum well and the thermal distribution of electrons and holes populating the states are the primary determinants of the emission spectral width. These factors are difficult to alter without, for example, using quantum dots as the active medium.

Methods and devices for broadening or extending the spectral width of an SLD are described in U.S. Pat. No. 6,184,542, incorporated herein by reference. The devices described have emission layers disposed side-by-side. Light emitting from an emission layer has a longer wavelength than light emitted from an adjacent layer in the direction of emission. The light of the different wavelengths results in a broadened output spectra at a point beyond the adjacent layer. A narrower spectral width is sometimes needed; however, existing methods and devices fail to provide a satisfactory and repeatable way to narrow the spectral output of a SLD.

SUMMARY

A light emitting device according to the principles of the invention provides amplified spontaneous emission without lasing. The emission spectrum for a device according to the principles of the invention comprises a shaped spectrum. A structure for acting on the emissions of the active layer narrows the quantum well emission spectrum. In one embodiment, the structure comprises an absorption layer having a cutoff wavelength slightly shorter than the quantum well wavelength, such that the spectral width is approximately the difference of the absorber cutoff wavelength and the quantum well wavelength.

In another aspect of the invention, the structure comprises a filter on the front facet of an SLD. A simple interference bandpass filter may comprise a half wave layer sandwich between a stack of quarter wave layers, though filters with more complex transmission spectra can be used. To reduce of the impact of reflections from the interference filter, back facet reflections are substantially reduced. This may be accomplished using a dissipating structure in the waveguide such that reflections propagating from the front facet are dissipated prior to reflections from the back facet and resulting coupling into the amplification section of the waveguide.

DETAILED DESCRIPTION

A light emitting device that emits amplified spontaneous emissions without lasing, such as an SLD, comprises a spectral width which includes the quauntum well wavelength and somewhat shorter wavelengths. In a device according to the principles of the invention, the spectral width can be shaped using a structure which acts upon the quantum well emission. In the exemplary embodiments, one structure is an absorber, such as another quantum well or bulk semiconductor material, and another structure is a filter having a predetermined characteristic (passband) disposed at the output of the device.

Figure 1:
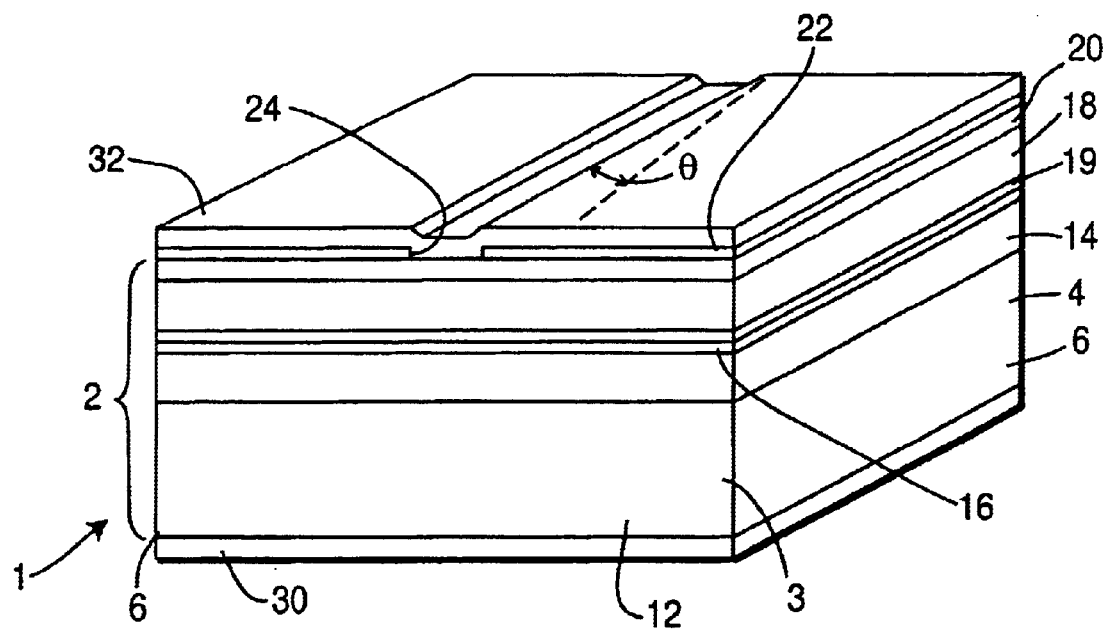
FIG. 1 shows a perspective view of a device according to the principles of the invention.

FIG. 1 illustrates an exemplary light emitting device 1 having an absorbing layer 19 and operable to provide a narrowed spectral emission. The device 1 comprises a body 2 having first and second opposed end faces 3 and 4, respectively, and sidewalls 6 extending therebetween. The body 2 includes a substrate 12 having a first cladding layer 14 thereon, an active layer 16 overlying the first cladding layer 14, an absorbing layer 19 overlying the active layer 16, a second cladding layer 18 overlying the absorbing layer 19 and a capping layer 20 overlying the second cladding layer 18. An electrically insulating layer 22, having an aperture 24 therethrough which extends between the end faces 3 and 4, respectively, and which is nonperpendicular relative to the first and second end faces 3 and 4, respectively, overlies the capping layer 20. A means for electrically contacting the body 2 comprises a first electrical contact 30 which overlies the surface of the substrate 12 opposite the first cladding layer 14 and a second electrical contact 32 which overlies the capping layer 20 in the aperture 24 and insulating layer 22.

The substrate 12, first cladding layer 14, and capping layer 20 are of one conductivity type and the second cladding layer 18 is of the opposite conductivity type. The refractive index of the active layer 16 should be greater than the refractive index of both the first and second cladding layers 14 and 18, respectively. The body is typically composed of binary group III-V compounds such as GaAs and alloys of such compounds.

In the device shown, the active layer comprises a quantum well. The quantum well emits light over a spectrum herein referred to as the spontaneous emission spectrum. The spectrum comprises the quantum well wavelength and somewhat shorter wavelengths. The spontaneous emission spectrum is the spectrum from the quantum well when it is electrically pumped. The density of the states of the quantum well and the thermal distribution of the electrons and holes populating the states are the primary determinants of the emission spectral width. The spontaneous emission spectrum is narrowed by interposing the absorbing layer 19. The material of the absorbing layer absorbs energy levels corresponding to wavelengths below its cutoff wavelength. To narrow the quantum well spectrum, the absorbing layer 19 has a cutoff wavelength located in the emission spectrum but shorter than the quantum well wavelength. The full spectral width is approximately the difference between the absorber cutoff wavelength and the quantum wavelength.

The absorbing layer 19 can be another quantum well or bulk semiconductor. The cutoff wavelength for the absorber can be designed through the composition of the absorber in the case of bulk semiconductor absorber, and through the composition, thickness, and strain in the case of a quantum well absorber. The same process used to fabricate the rest of the SLD can be used to fabricate the absorber. Thus, the properties are reproducible. The absorber ideally should be located near the peak of the mode where the coupling between spontaneous emission and absorber will be strong. The absorber is not electrically pumped and photo generated electron-hole pairs should recombine predominantly by non-radiative processes. The absorber is near the modal peak when it is placed in the p-clad or n-clad near the confinement layer. For simplicity, the absorber 19 is shown in clad 18, but it can be placed in the other clad 14 or in both clad layers, where one clad is of one conductivity type and the other clad is of another conductivity type. The absorber 19 has a smaller band gap energy then the clad, so its index of refraction is higher. The thickness in the exact location of the absorber must be designed to maintain a single mode structure where the optical mode has a large overlap with the quantum well in the active region.

Because the absorber layer 19 is in the clad rather than the confinement layer, the absorber is not electrically pumped and does not radiate. If the absorber 19 is in the p-clad, the only injected electrons into the absorbing layer 19 are those that escape the confinement layer by overcoming the barrier at the conduction band discontinuity at the confinement layer and p-clad interface. Likewise, the only holes injected into the absorber 19 in the n-clad are those that escape the confinement layer on the n-clad side. The absorber layer 19 can be doped the same conductivity as the surrounding clad to avoid the electrostatic potential barrier that impedes current flow into the active region. Doping will also reduce the nonradiative lifetime in the absorbing layer, and thus reduce re-emission of absorbed radiation.

Figure 2:
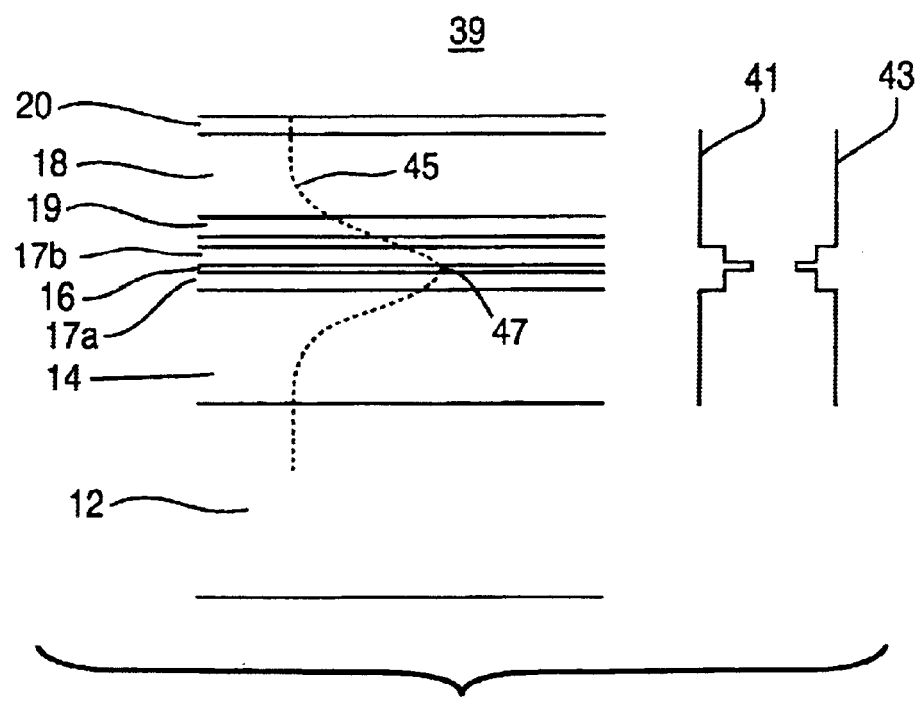
FIG. 2 shows an exemplary epitaxial structure of the device of FIG. 1 with a corresponding band diagram and optical mode diagram.

FIG. 2 is a diagram 39 for an exemplary epitaxial structure for the device 1 of FIG. 1. The diagram 39 includes a dotted line 45 indicating the optical mode of the device 1, and band diagrams 41 and 43 for the conduction and valence bands, respectively. In this exemplary structure, the substrate 12 is composed of n-type material, the first clad layer 14 is n-clad, the second clad layer 18 is p-clad and the cap 20 comprises p-type material. The active layer 16 or quantum well has adjacent confinement layers 17a and 17b. The absorbing layer 19 is adjacent the confinement layer 17b overlying the quantum well 16 and is in the p-clad layer 18. As shown by the optical mode 45, the absorber 19 is near the modal peak 47 of the optical mode. The conduction band diagram 41 and the valence band diagram 43 indicate the effect of the absorbing layer 19 on the spectral emission of the device 1 in the band domain.

Figure 3:
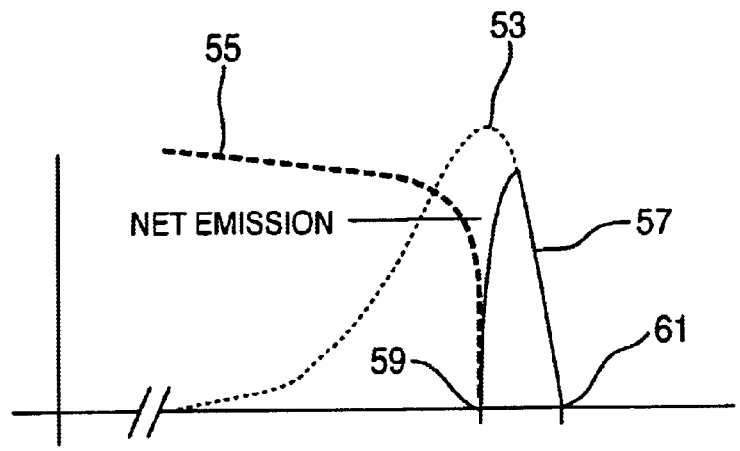
FIG. 3 illustrates exemplary spectrums relative to the device of FIG. 1.

FIG. 3 illustrates a spectral emission diagram 50 of the device of FIG. 1 in the wavelength domain. The spontaneous emission spectrum 53 is shown as a dotted line, and the absorption layer spectrum 55 is shown as a dashed line. The device is designed such that the absorption layer absorbs substantially all the radiation output by the quantum well at wavelengths below the absorption layer cutoff wavelength. This results in the net emission spectrum 57 shown as a solid line. The net emission spectrum 57 has a lower wavelength 59 approximately equal to the cutoff wavelength of the absorbing layer and an upper wavelength 61 approximately equal to the quantum well wavelength. The net emission spectrum 57 is narrower than the spontaneous emission spectrum 53 due to absorption of wavelengths below the absorbing layer cutoff frequency.

Figure 4A:
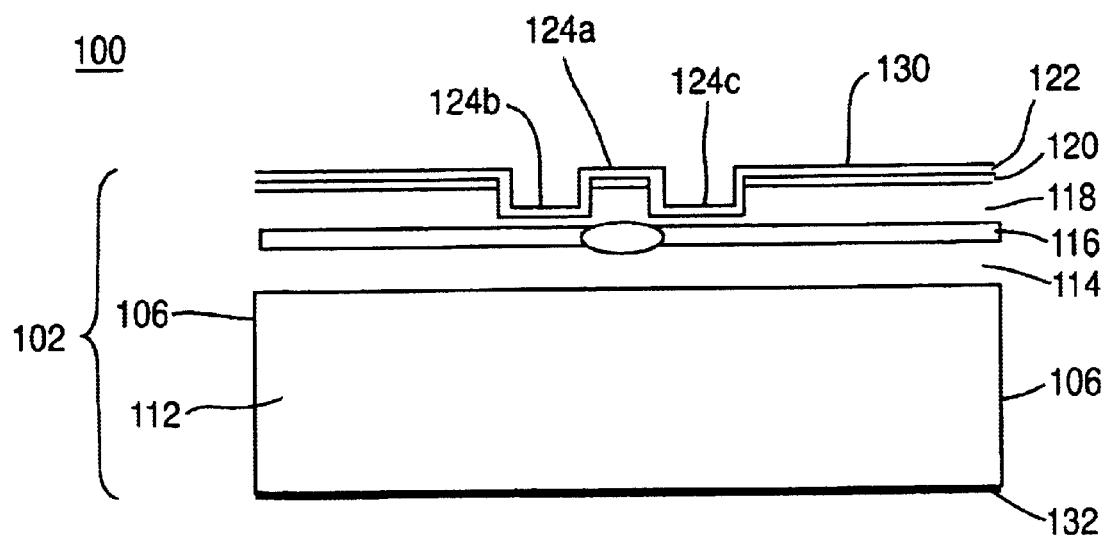
FIGS. 4a and 4b show a cross sectional view and a top view respectively of a device according to the principles of the invention.
Figure 4B:
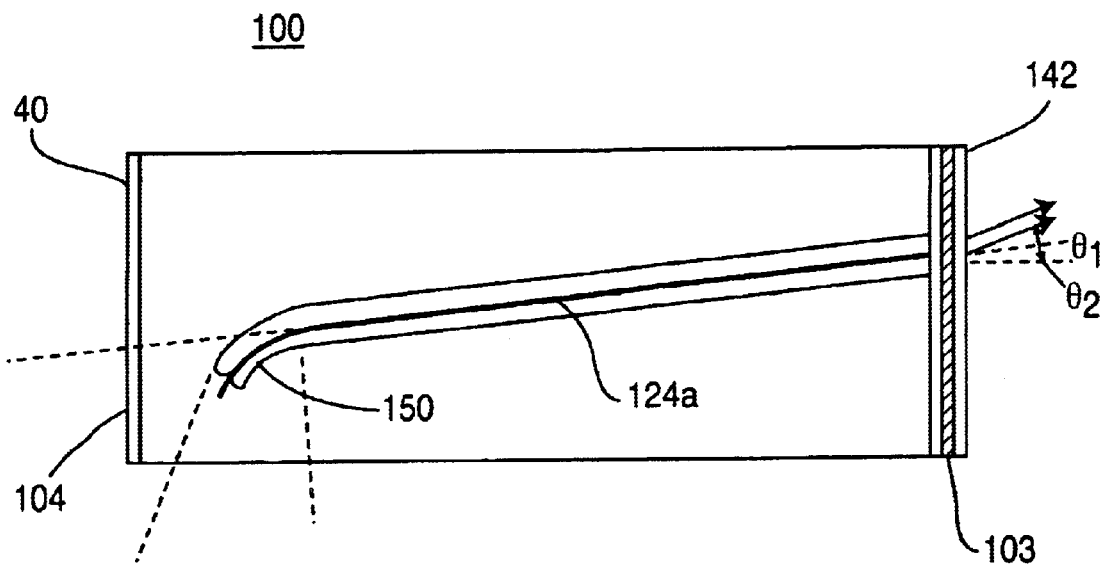

FIGS. 4a and 4b show a cross sectional view and a top view respectively of another device 100 according to the principles of the invention. In this aspect of the invention, the structure responsive to the active layer emissions comprises a filter at the output of the waveguide. The filter substitutes for antireflective coating, and passes light in the desired wavelengths, also referred to as the filter passband.

In this example, the device 100 is a ridge waveguide SLD. The device 100 comprises a body 102 having opposed faces (not shown) and opposed sidewalls 106. The body 102 includes a substrate 112 having a first cladding layer 114 thereon, an undoped active layer overlying the first cladding layer 114, a second cladding layer 118 overlying the active layer 116, and a capping layer 120 overlying the second cladding layer 118. A dielectric layer 122 overlies the capping layer 120, except in the area of the waveguide 124a. An electrical contact 132 overlies the substrate and another electrical contact 130 overlies the dielectric layer 122, except in the area of the waveguide 124a which waveguide does not comprise a dielectric layer. Channels 124b, 124c are adjacent to the waveguide 124a.

In one embodiment, the undoped active layer 116 overlies a cladding layer 114 of one conductivity type, such as n-type, and has a cladding layer 118 of the opposite conductivity type, such as p-type, overlying it 116. These layers are deposited on the substrate 112, which is of the first conductivity type. For example, the substrate 112 can be n doped semiconductor material. In the exemplary configuration, the electrical contact 132 overlying the dielectric 122 is heavily doped p-type material and the other contact 130 is n-type. The channel regions 124b, 124c are formed by etching. Various materials can be used to make a light emitting device according to the principles of the invention. For example, the substrate can be GaAs and the active region can be materials such as GaAs, AlGaAs, or InGaAs. The cladding layers can be doped AlGaAs. In another example, the substrate can be doped InP and the active and clad layers can be InGaAsP of appropriate composition. Of course other materials can be used, such as other Group III-V compounds and Group II-VI compounds.

In a ridge waveguide configuration as described above, the effective refractive index in the channel regions is lower than that in the ridge by an amount which depends on the residual thickness of the p-clad material under the channels. Light is guided in the active layer under the ridge by virtue of the index difference between the ridge 124a and the channels 124b, 124c. Upon application of a voltage across the metal contacts 130, 132, current flows only through the region with the dielectric opening. At low current, the active layer 116 is absorbing, and the emitted light consists of spontaneous emission. Beyond a certain current, the spontaneous emission is amplified spontaneous emission. The light is guided along the ridge 124a and emitted at relatively high power. At these current values, the region with the current flow is called the pumped region. Current does not flow in the region of the semiconductor structure under the dielectric, and this region is the unpumped region. The unpumped region is absorbing.

For single mode operation, the lateral index step is given by $$\Delta n = n_1 - n_2 \leq \frac{\left(\frac{\lambda}{W}\right)^2}{4(n_1 + n_2)}$$

(1) where $\lambda$ is the wavelength of the light, as shown in H. Kogelnik, Integrated Optics, 2d ed., Chap. 2, Springer-Verlak, New York. In this equation, W is the ridge width and the effective refractive indices under the channels are n1 and n2, respectively. $\lambda$ is the wavelength of the light.

FIG. 4b shows a top view of the light emitting device 100. In this view one facet 104 is coated with anti-reflecting coating 40. The other facet 103 comprises a bandpass filter 142. The ridge waveguide 124a emits light at its 124a front facet 103 termination. The waveguide 124a forms an angle $\theta_1$ relative to the direction perpendicular to the front facet 103. The angle $\theta_2$ of the output light 139 is larger than the angle of the waveguide, by virtue of Snell's law. The tilt angle, $\theta_1$, can be any value below the critical angle at the front facet 103, at which point the output angle is 90°, and light cannot be coupled out of the device 100. In one embodiment, the tilt angle is 5° to 7°, which provides ease of coupling.

The filter 142 is any structure having an appropriate transmission spectrum. For example, the filter can be two back to back quarter wave reflector stacks. These can be vacuum deposited on the front facet 103. By placing stacks back to back, the two middle layers, being quarter wave layers of the same material, constitute a half wave cavity. The bandwidth of the filter is determined by the reflectivity of the stacks, which in turn is determined the the number of layers in the stack and their relative refractive index. The location of the filter bandpass with respect to the emission spectrum determines the output spectrum of the device 100. For example, an unwanted hump in the emission spectrum can be reduced with a filter having a center wavelength such as to attenuate the hump. Several combinations of layers can be used to modify the emission spectrum in numerous ways.

A filter such as described above may reflect light back into the waveguide of the device 100. The curved section 150 proximate the rear or back facet 104 is a light dissipating structure. The curvature causes light to dissipate or radiate from the waveguide 124a before it can reflect back into the waveguide 124a from the back facet 104. In this configuration, little or no light radiated from the waveguide 124a can reach the straight (amplification) section of the waveguide 124a. Thus, light reflected from the filter is dissipated without further reflections from the back facet, which can cause unwanted characteristics, or even lasing.

The radiation from a bent waveguide (or fiber) is determined by the radius of curvture of the bend. Radiation is small if the bend radius is larger than some critical value, Rc, and it is large if the radius is much smaller than Rc. The critical radius is given by (2) $R_c=$ $$\frac{3}{2\pi\sqrt{2}} \frac{\sqrt{n_1}}{(\Delta n)^{\frac{3}{2}}} \lambda,$$

where $\Delta n$ is given by equation (1) above for a single-mode waveguide. See E. A. J. Marcatili, Bell System Tech Journal, p. 2103–2132, September 1969. Where a curved radiating structure is used, the radius of curvature should be chosen much less than Rc as limited by practical considerations. In one aspect, a first radius of curvature can be chosen closer to Rc, and, after some radiating effect, a second smaller radius of curvature can be chosen. Of course, the optimal radius or radii, can be found using trial and error or other techniques depending upon the precise light emitting device and application under consideration.

Figure 5:
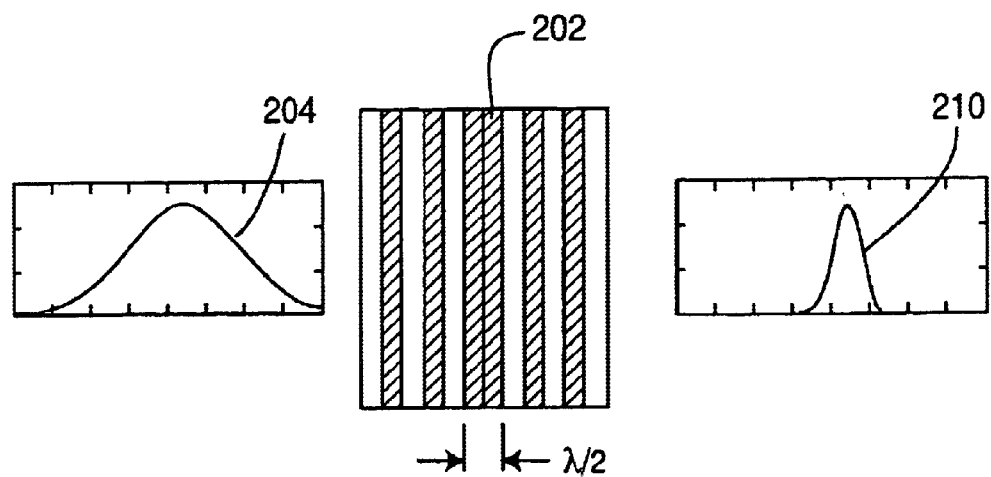
FIG. 5 illustrates exemplary spectrums relative to the device of FIG. 4.

FIG. 5 illustrates exemplary spectrum shaping using a filter 202 as described above. The emission spectrum diagram 204 is shown as an input to the filter 202. The output spectrum 210 is narrower than the emission spectrum due to the bandpass characteristic of the filter 202. Other spectrum shaping can be accomplished by choosing a different filter characteristic.

What is claimed is:

1. A super luminescent diode, comprising:
   an active layer having an emission spectrum including an emission wavelength; and
   a structure responsive to emissions from the active layer and operable to attenuate emissions having wavelengths less than a cutoff wavelength, wherein the cutoff wavelength is less than the emission wavelength and is located within the emission spectrum, wherein the structure comprises an absorbing layer disposed substantially parallel to the active layer.

2. A super luminescent diode, comprising:
   an optical beam path disposed between and parallel to a first cladding layer and a second a cladding layer, the optical beam path including an active layer having an emission wavelength and a spectral width, and
   an absorption layer responsive to the active layer and operable to attenuate active layer emissions having wavelengths less than an absorption layer cutoff wavelength, the absorption layer being disposed in one of the first cladding layer or the second cladding layer.

3. The super-luminescent diode of claim 2 wherein, the absorption layer comprises a semiconductor absorber material.

4. The super-luminescent diode of claim 2 wherein the absorption layer comprises a quantum well.

5. The super-luminescent diode of claim 2, further comprising a second absorption layer disposed in the other of the first cladding layer or the second cladding layer.

6. The super-luminescent diode of claim 2, the absorption layer being disposed near an active layer modal peak.

7. The super-luminescent diode of claim 2 wherein the first cladding layer and the second cladding layer comprise doped material of different conductivity, the absorption layer comprising doped material of the same conductivity type as either the first cladding layer or the second cladding layer.

8. A super-luminescent diode comprising:
   an active layer operable to provide emissions having an emission spectrum;
   a filter responsive to the emissions within the spontaneous emission spectrum; and
   a waveguide in cooperation with the active layer, the waveguide including a first end, and output end and a dissipation structure, the emissions traversing the waveguide to the output end, the filter disposed to transmit the emissions from the output end according to a transmission spectrum, wherein reflections from the filter traverse the waveguide toward the first end, the dissipation structure substantially dissipating the reflections.

9. The super-luminescent diode of claim 8 the filter having an emission spectrum defining a passband having at least one cutoff frequency, wherein the filter passes emissions in the passband and reflects or absorbs at least some emissions outside the passband.

10. The super-luminescent diode of claim 8 wherein the dissipation structure includes a nonlinear waveguide section.

11. The super-luminescent diode of claim 8 wherein the filter comprises layers of semiconductors, dielectrics, or metals.

12. The super-luminescent diode of claim 8 wherein the dielectrics comprises quarter-wave material.

13. A method for shaping an emission spectrum of a super-luminescent diode without causing lasing, comprising the steps of:
    filtering emissions at an output of the super-luminescent diode; and
    dissipating emissions reflected from the filter into an amplification section of the super-luminescent diode prior to additional reflections.

14. The super-luminescent diode of claim 13 wherein the dissipating step includes the step of absorbing the reflected emissions.

15. The super-luminescent diode of claim 14 wherein the step of absorbing the reflected emissions includes the step of disbursing the reflected emissions in an unpumped region of the super-luminescent diode.

16. The super-luminescent diode of claim 8 wherein the super-luminescent diode comprises a ridge waveguide operating in a single mode.

17. The super-luminescent diode of claim 1 wherein the absorbing layer is fabricated using the same process as the active layer.

* * * * *